(12) United States Patent
Nakase

(10) Patent No.: US 6,544,901 B1
(45) Date of Patent: *Apr. 8, 2003

(54) PLASMA THIN-FILM DEPOSITION METHOD

(75) Inventor: Risa Nakase, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/578,726

(22) Filed: May 26, 2000

Related U.S. Application Data

(63) Continuation of application No. PCT/JP98/05219, filed on Nov. 19, 1998.

(30) Foreign Application Priority Data

Nov. 27, 1997 (JP) .............................................. 9-343998
Feb. 13, 1998 (JP) ........................................... 10-048882

(51) Int. Cl.$^7$ ............................................ H01L 21/469
(52) U.S. Cl. ........................ 438/780; 438/622; 438/789
(58) Field of Search ................................ 438/584, 618, 438/622, 623, 789, 790, 788, 784, 774, 780; 219/121.43; 257/56, 57, 632, 642

(56) References Cited

U.S. PATENT DOCUMENTS

| | | | |
|---|---|---|---|
| 5,462,784 A | | 10/1995 | Grill et al. |
| 5,942,328 A | | 8/1999 | Grill et al. |
| 5,989,998 A | * | 11/1999 | Sugahara et al. ............ 438/623 |
| 6,057,226 A | * | 5/2000 | Wong ........................... 427/99 |
| 6,159,862 A | * | 12/2000 | Yamada et al. ............. 438/712 |
| 6,215,087 B1 | * | 4/2001 | Akahori et al. ........ 219/121.43 |

FOREIGN PATENT DOCUMENTS

| | | |
|---|---|---|
| JP | 63-192867 | 8/1988 |
| JP | 63-235463 | 9/1988 |
| JP | 9-246263 | 9/1997 |
| JP | 9-246264 | 9/1997 |

OTHER PUBLICATIONS

H. Yasuda et al., "Some Aspects of Plasma Polymerization of Fluorine–Containing Organic Compounds," Journal of Polymer Science, vol. 15, 2411–2425 (1977).

R.E. Sah et al., "Amorphous Carbon Coatings Prepared by High Rate RF Plasma Deposition from Fluorinated Benzenes", Applied Physics Letter 46, Apr. 1985.

R.E. Sah, "Mass Spectrometric Study of Gas Evolution from Plasma–Deposited Fluorohydrogenated Amorphous Carbon Films on Heating", Thin Solid Films, vol. 167, pp. 255–260, (1988).

A. Grill et al., "Wear Resistant Fluroniated Diamondlike Carbon Films", Diamond Films and Technology, vol. 6, No. 1, pp. 13–21, (1996).

* cited by examiner

*Primary Examiner*—Kamand Cuneo
*Assistant Examiner*—Lisa Kilday
(74) *Attorney, Agent, or Firm*—Finnegan, Henderson, Farabow, Garrett & Dunner, LLP

(57) ABSTRACT

As thin-film deposition gases, cyclic $C_5F_8$ gas and a hydrocarbon gas, e.g., $C_2H_4$ gas, are used. These gases are activated as plasma under a pressure of, e.g., 0.1 Torr, to deposit a CF film on a semiconductor wafer at a process temperature of 400° C. using active species thereof. Alternatively, cyclic $C_6F_6$ gas is used as a thin-film deposition gas, and activated as plasma under a pressure of, e.g., 0.06 Pa, to deposit a CF film on a semiconductor wafer at a process temperature of 400° C. using active species thereof.

12 Claims, 20 Drawing Sheets

|  | THIN-FILM DEPOSITION GAS | MICROWAVE POWER (kW) | BIAS POWER (kW) | VARIATION IN WEIGHT (%) |
|---|---|---|---|---|
| EXAMPLE 1 | $C_6F_6$ | 1.0 | 0.5 | 1.4 |
|  | $C_6F_6$ | 1.0 | 1.0 | 1.4 |
|  | $C_6F_6$ | 1.0 | 1.5 | 1.5 |
|  | $C_6F_6$ | 0.8 | 1.5 | 1.6 |
|  | $C_6F_6$ | 1.0 | 1.5 | 1.5 |
|  | $C_6F_6$ | 1.5 | 1.5 | 1.2 |
| EXAMPLE 2 | $C_7F_8$ | 1.0 | 1.0 | 1.9 |
| EXAMPLE 3 | $C_4F_8/C_7H_5F_3$ | 1.0 | 1.0 | 2.2 |
| EXAMPLE 4 | $C_4F_8/C_7H_8$ | 1.0 | 0.75 | 2.8 |
| COMPARATIVE EXAMPLE | $C_4F_8/C_2H_4$ | 2.0 | 1.5 | 4.4 |

FIG.23

PLASMA THIN-FILM DEPOSITION METHOD

This application is a continuation of International Application No. PCT/JP98/05219, filed Nov. 19,1998, the content of which is incorporated herein by reference.

TECHNICAL FIELD

The present invention relates to a method for depositing a fluorine containing carbon film, which can be used as, e.g., an interlayer dielectric film (an interlayer dielectric film) of a semiconductor device, by a plasma treatment.

BACKGROUND ART

In order to achieve the high integration of a semiconductor device, it has been developed to provide devices, such as the scale down of a pattern and the multilayering of a circuit. As one of such devices, there is a technique for multilayering wirings. In order to provide a multi-layer metallization structure, a number n wiring layer and a number (n+1) wiring layer are connected to each other by means of a conductive layer, and a thin-film called an interlayer dielectric film as an interlayer dielectric film is formed in a region other than the conductive layer.

A typical interlayer dielectric film is an $SiO_2$ film. In recent years, in order to more accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a smaller relative dielectric constant than that of the $SiO_2$ film. As one of such materials, it has been studied to put an SiOF film having a relative dielectric constant of 3.5 to practical use. The inventor has taken notice of a fluorine containing carbon film (which will be hereinafter referred to as a "CF film") having a still smaller relative dielectric constant.

FIG. 19 shows a part of a circuit part formed on a wafer, wherein reference numbers 11 and 12 denote CF films, 13 and 14 denoting conductive layers of tungsten (w), 15 denoting a conductive layer of aluminum (Al), 16 denoting an $SiO_2$ film, into which P and B have been doped, and 17 denoting an n-type semiconductor region. The W layer 13 is formed at a process temperature of 400 to 450° C. At this time, the CF films 11 and 12 are heated to the process temperature. However, if the CF films are heated to such a high temperature, a part of C—F bonds are cut, so that F (fluorine) gases are mainly desorbed. The F gasses include F, CF, $CF_2$ gases and so forth.

If the F gases are thus desorbed, there are the following problems.
(a) The metal wirings of aluminum, tungsten and so forth are corroded.
(b) Although the insulator film also has the function of pressing the aluminum wiring to prevent the swell of aluminum, the pressing force of the insulator film on the aluminum wiring is decreased by the degassing. As a result, the aluminum wiring swells, so that an electrical defect called electromigration is easily caused.
(c) The insulator film cracks, so that the insulation performance between the wirings gets worse. When the extent of the crack increases, it is not possible to form any wiring layers at the next stage.
(d) If the amount of desorbed F increases, the relative dielectric constant increases.

DISCLOSURE OF THE INVENTION

It is therefore an object of the present invention to eliminate the aforementioned problems and to provide a method capable of depositing an insulator film of a CF film, which has strong bonds and which is difficult to be decomposed, e.g., an interlayer dielectric film of a semiconductor device.

According to one aspect of the present invention, according to a first aspect of the present invention, a plasma thin-film deposition method comprises the steps of: activating a thin-film deposition gas containing cyclic $C_5F_8$ gas to form a plasma; and depositing an insulator film of a fluorine containing carbon film on a substrate to be treated, with the plasma.

The thin-film deposition gas may contain cyclic $C_5F_8$ gas and at lease one of a hydrocarbon gas and hydrogen. The insulator film may be deposited under a process pressure of 5.5 Pa or lower. The temperature of the substrate to be treated may be 360° C. or higher.

According to a second aspect of the present invention, a plasma thin-film deposition method comprises the steps of: activating a thin-film deposition gas containing linear $C_5F_8$ gas to form a plasma; and depositing an insulator film of a fluorine containing carbon film on a substrate to be treated, with the plasma.

The thin-film deposition gas may contain linear $C_5F_8$ gas and at lease one of a hydrocarbon gas and hydrogen. The insulator film may be deposited under a process pressure of 0.3 Pa or lower. The temperature of the substrate to be treated may be 360° C. or higher.

According to a third aspect of the present invention, a plasma thin-film deposition method comprises the steps of: activating a thin-film deposition gas containing a gas of a benzene ring containing compound to form a plasma; and depositing an insulator film of a fluorine containing carbon film on a substrate to be treated, with the plasma.

The benzene ring containing compound may be a compound of C and F. The compound of C and F may be $C_6F_6$. The compound of C and F may also be $C_7F_8$. Alternatively, the benzene ring containing compound may be a compound of C, F and H. The compound of C, F and H may be $C_7H_5F_3$.

According to the first through third aspects of the present invention, it is possible to produce a CF film which has high thermostability and a small amount of desorbed F gas. Therefore, if this CF film is used as, e.g., an interlayer dielectric film of a semiconductor device, it is possible to prevent the corrosion of a metal wiring, the swell of an aluminum wiring and the crack of the film. Since CF films have been widely noticed as insulator films having a small relative dielectric constant and since the scale down and high integration of semiconductor devices have been required, the present invention is effective in the practical use of CF films as insulator films.

BRIEF DESCRIPTION OF THE DRAWINGS

FIG. 23 is a schematic diagram showing the variations in weight in Examples and Comparative Examples;

BEST MODE FOR CARRYING OUT THE INVENTION

Figure 1:
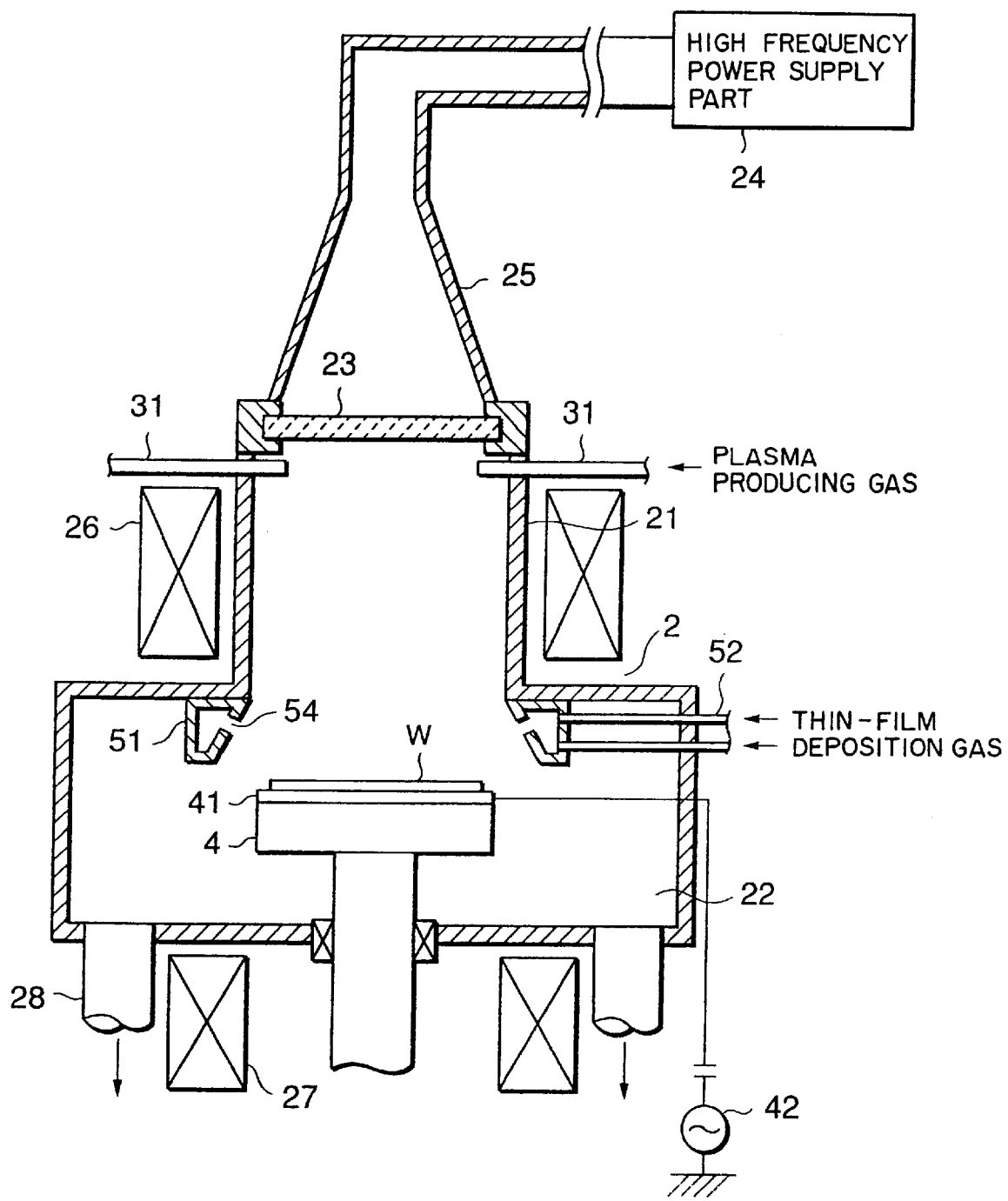
FIG. 1 is a longitudinal section of an example of a plasma treatment system for carrying out a method according to the present invention.

FIG. 1 shows an example of a plasma treatment system for use in the preferred embodiments of the present invention. This system has a vacuum vessel 2 of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 so as to hold vacuum in the vacuum vessel 2. Outside of the transmission window 23, there is provided a waveguide 25 connected to a high-frequency power supply part 24 for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a gas source (not shown), e.g., an Ar gas source, so that Ar gas can be uniformly supplied to the upper portion in the first vacuum chamber 21.

In the second vacuum chamber 22, a wafer mounting table 4 is provided so as to face the first vacuum chamber 21. The mounting table 4 has an electrostatic chuck 41 on the surface thereof. The electrode of the electrostatic chuck 41 is connected to a dc power supply (not shown) for absorbing a wafer and to a high-frequency power supply part 42 for applying a bias voltage for implanting ions into the wafer.

On the other hand, in the upper portion of the second vacuum chamber 22, i.e., in a portion of the second vacuum chamber 22 communicated with the first vacuum chamber 21, a ring-shaped thin-film deposition gas supply part 51 is provided. For example, two kinds of thin-film deposition gases are supplied from gas supply pipes 52 and 53 to the thin-film deposition gas supply part 51, so that the mixed gas thereof is supplied to the vacuum vessel 2 via gas holes 54 formed in the inner peripheral surface of the thin-film deposition gas supply part 51.

In the vicinity of the outer periphery of the side wall defining the first vacuum chamber 21, a magnetic field forming means, e.g., a ring-shaped main electromagnetic coil 26, is arranged. Below the second vacuum chamber 22, a ring-shaped auxiliary electromagnetic coil 27 is arranged. To the bottom of the second vacuum chamber 22, exhaust pipes 28 are connected at, e.g., two positions which are symmetrical with respect to the central axis of the vacuum chamber 22.

The first preferred embodiment of the present invention will be described below.

A method for depositing an interlayer dielectric film of a CF film on a wafer W, which serves as a substrate to be treated, using the system shown in FIG. 1 will be described. First, a gate valve (not shown) provided in the side wall of the vacuum vessel 2 is open, and the wafer W, on which a wiring of, e.g., aluminum, has been formed, is introduced from a load-lock chamber (not shown) by means of a transport arm (not shown) to be mounted on the mounting table 4 to be electrostatically absorbed by means of the electrostatic chuck 41.

Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, a plasma producing gas, e.g., Ar gas, is introduced from the plasma gas nozzles 31 into the first vacuum chamber 21 at a predetermined flow rate, and a thin-film deposition gas is introduced from the thin-film deposition gas supply part 5 into the second vacuum chamber 22 at a predetermined flow rate.

Figure 2:
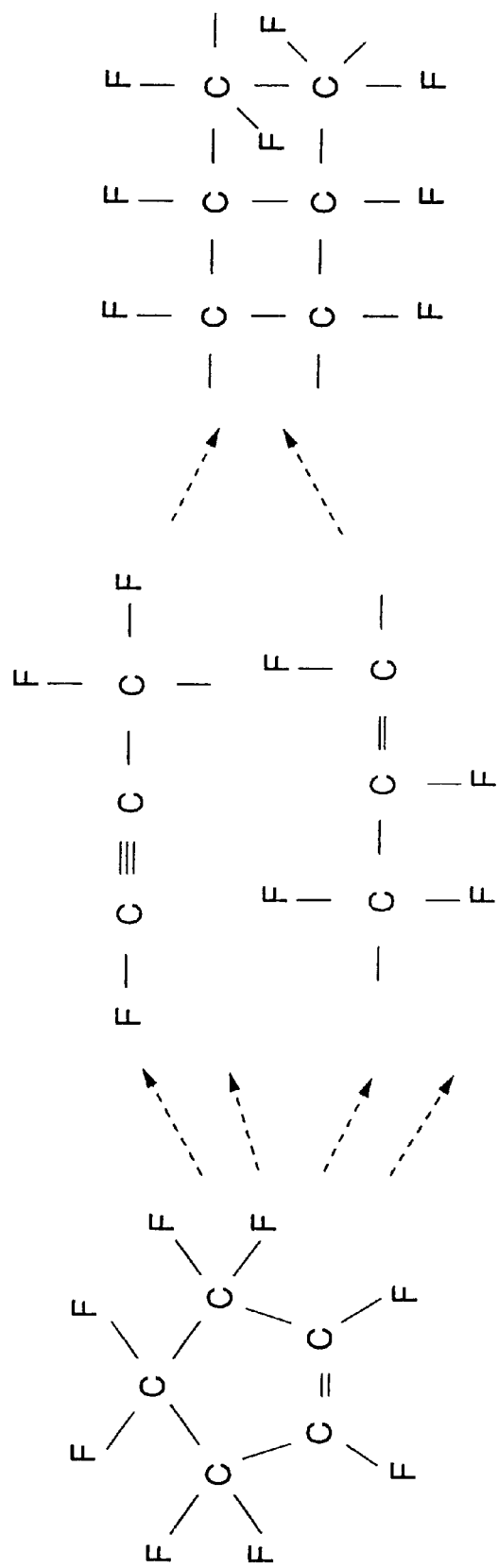
FIG. 2 is a schematic diagram for explaining the decomposition and recombination of a thin-film deposition gas for use in the first preferred embodiment of the present invention.

This preferred embodiment is characterized by the thin-film deposition gas. As shown on the left side of FIG. 2(a), cyclic $C_5F_8$ gas is used as the thin-film deposition gas. As the thin-film deposition gas, a hydrocarbon gas, e.g., $C_2H_4$ gas is also used. The $C_5F_8$ and $C_2H_4$ gasses are supplied to the vacuum vessel 2 via the thin-film deposition gas supply part 5 from the gas supply pipes 52 and 53, respectively. Then, the interior of the vacuum vessel 2 is held under a predetermined process pressure, and a bias voltage of 13.56 MHz and 1500 W is applied to the mounting table 4 by means of the high-frequency power supply part 42. In addition, the surface temperature of the mounting table 4 is set to be about 400° C.

A high-frequency wave (a microwave) of 2.45 GHz from the high-frequency power supply part 24 passes through the waveguide 25 to reach the ceiling of the vacuum vessel 2, and passes through the transmission window 23 to be introduced into the first vacuum chamber 21. On the other hand, a magnetic field extending from the upper portion of the first vacuum chamber 21 to the lower portion of the second vacuum chamber 22 is formed in the vacuum vessel 2 by the electromagnetic coils 26 and 27. The intensity of the magnetic field is, e.g., 875 gausses in the vicinity of the lower portion of the first vacuum chamber 21. The electron cyclotron resonance is produced by the interaction between the magnetic field and the microwave. By this resonance, Ar gas is activated as plasma and enriched. The plasma flows from the first vacuum chamber 21 into the second vacuum chamber 22 to activate $C_5F_8$ gas and $C_2H_4$ gas, which have been supplied thereto, to form active species to deposit a CF film on the wafer W. Furthermore, when a device is actually produced, the CF film is etched with a predetermined pattern, and, e.g., a W film is embedded in a groove portion to form a W wiring.

Figure 3:
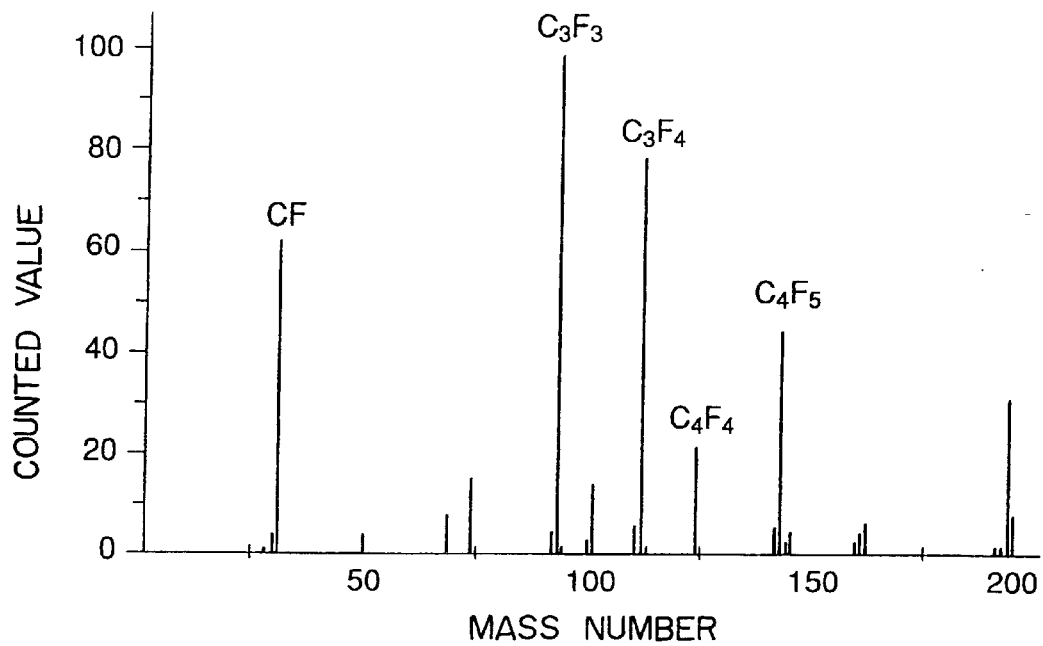
FIG. 3 is a characteristic diagram showing the results of a mass spectrometry when cyclic $C_5F_8$ gas is decomposed.

The CF film thus deposited has a strong bond, and high thermostability as can be seen from the results of experiment which will be described later. That is, the amount of the desorbed F gases is small even at a high temperature. It is considered that the reason for this is that the decomposition products of cyclic $C_5F_8$ are easy to form a three-dimensional structure shown in FIG. 2, so that C—F bonds are strengthen and difficult to be cut even if heat is applied thereto. The decomposition products of cyclic $C_5F_8$ were vaporized under a reduced pressure of 0.002 Pa, and the vaporized decomposition products were analyzed by means of a mass spectrometer. The obtained results are shown in FIG. 3. It can be seen from the results that many $C_3F_3$ and $C_4F_4$, which are easy to form three-dimensional structures, exist as decomposition products.

Figure 4:
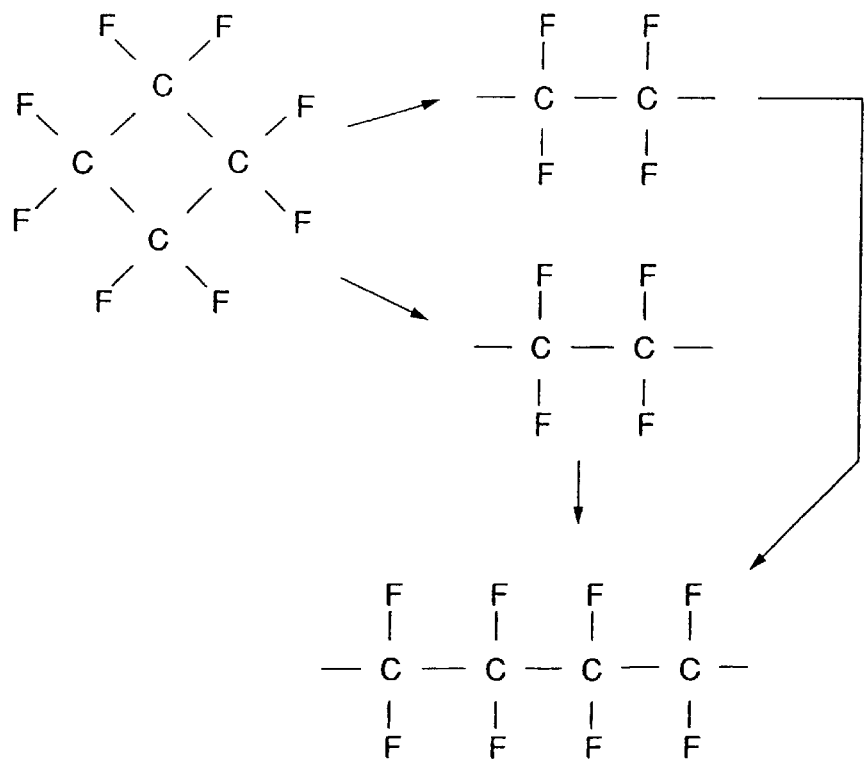
FIG. 4 is a schematic diagram for explaining the decomposition and recombination of $C_4F_8$ gas compared with the thin-film deposition gas for use in the first preferred embodiment of the present invention.

As a comparative example, considering a case where cyclic $C_4F_8$ gas is used as a thin-film deposition gas, the decomposition products of $C_4F_8$ include the most $C_2F_4$ to easily form a straight chain structure as shown in FIG. 4. Therefore, the thermostability of a CF film deposited using $C_4F_8$ gas is low, as can be seen from the results of comparative experiments which will be described later.

In view of the foregoing, $C_5F_8$ gas is essentially used as a thin-film deposition gas according to the present invention. As a gas added thereto, a hydrocarbon gas, such as $C_2H_4$, $CH_4$ or $C_2H_6$ gas, hydrogen gas or a mixed gas of the hydrocarbon gas and hydrogen gas may be used.

EXAMPLE 1

Figure 5:
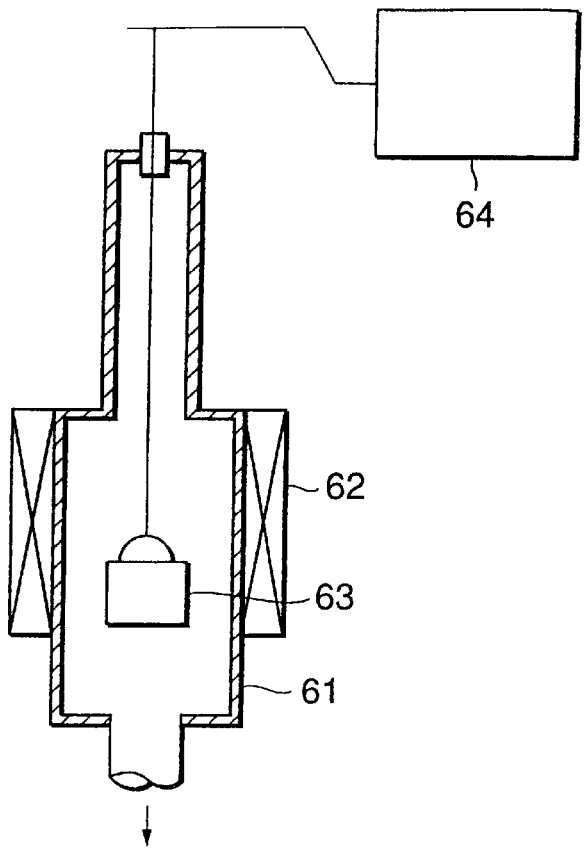
FIG. 5 is a schematic sectional view of a measuring device for examining the variation in weight of a thin-film.

Using a measuring device shown in FIG. 5, the variation in weight of a thin-film at a high temperature was examined as an index of the thermostability of the thin-film. In FIG. 5, reference number 61 denotes a vacuum vessel, 62 denoting a heater, 63 denoting a crucible suspended from a beam of a light balance mechanism, and 64 denoting a weight measuring part. As a measuring method, there was adopted a method for shaving a CF film on a wafer to put the shaven CF film in the crucible 63 to raise the temperature in the crucible 63 to 425° C. under a vacuum atmosphere to heat the CF film for 2 hours to examine the variation in weight in the weight measuring part 64. In the thin-film deposition process described above in the preferred embodiment, the temperature during the thin-film deposition was set to be any one of seven temperatures, 300° C., 325° C., 350° C., 360° C., 380° C., 400° C., 420° C. and 440° C., and the variations in weight of CF films obtained at the respective process temperatures were examined. The results thus obtained are shown in FIG. 6.

In the above thin-film deposition process, the flow rates of $C_5F_8$, $C_2H_4$ and Ar gases were set to be 60 sccm, 20 sccm and 150 sccm, respectively. In addition, the microwave power (the high-frequency power supply part 24) and the bias power (the high-frequency power supply part 42) were set to be 2000 W and 1500 W, respectively. Moreover, the process pressure was set to be 0.1 Pa. Furthermore, the variation in weight means a value of $\{(A-B)/A\} \times 100$ assuming that the weight of the thin-film in the crucible before heating is A and the weight of the thin-film in the crucible after heating is B.

Figure 6:
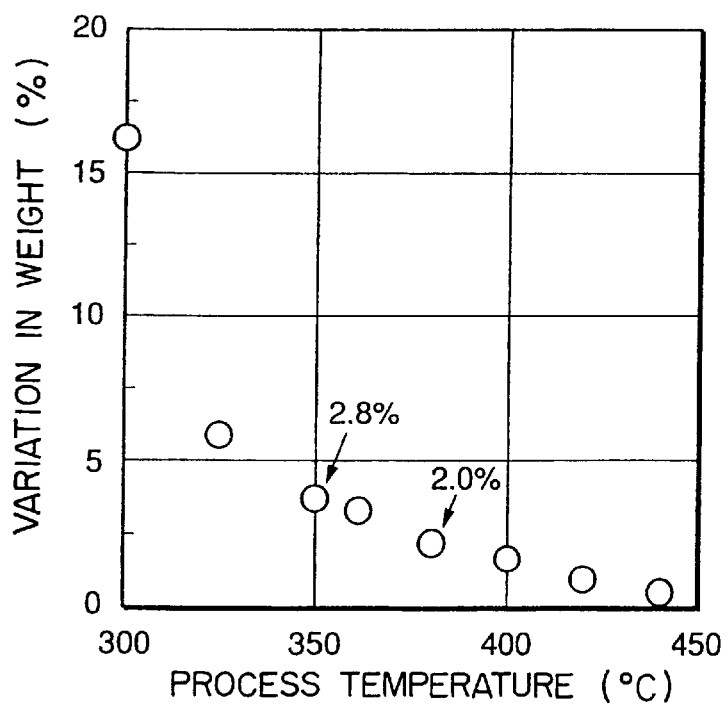
FIG. 6 is a characteristic diagram showing the relationship between the variations in weight of a CF film, which is deposited using cyclic $C_5F_8$ gas and $C_2H_4$ gas, and process temperatures.

As can be seen from FIG. 6, the variation in weight at a process temperature of 360° C. is 2.8% which is less than 3%, and the variation in weight at a process temperature of 400° C. or higher is 1.4% which is very low, so that thermostability is high and the amount of degassing is small.

Figure 7:
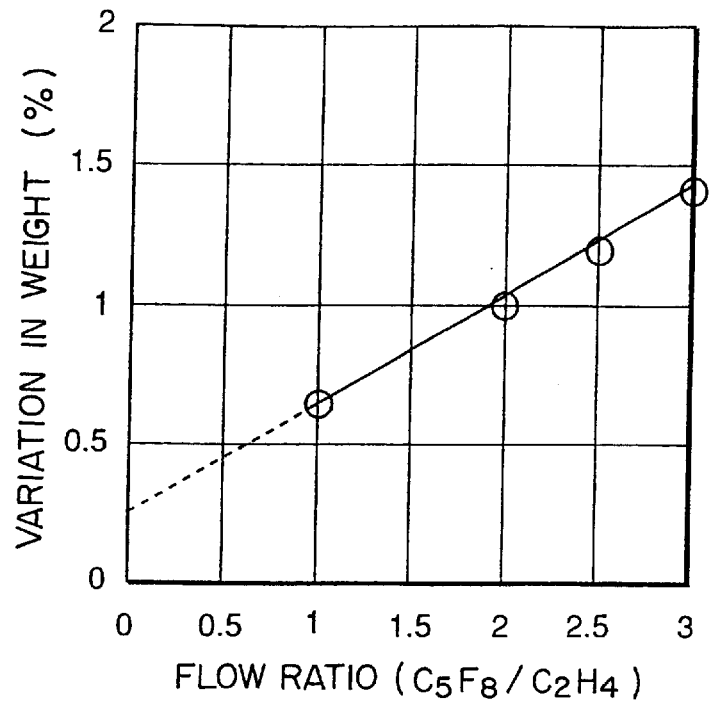
FIG. 7 is a characteristic diagram showing the relationship between the variations in weight of a CF film, which is deposited using cyclic $C_5F_8$ gas and $C_2H_4$ gas, and the flow ratios of thin-film deposition gases.

In addition, CF films were deposited at a process temperature of 400° C. at various flow ratios of $C_5F_8$ gas to $C_2H_4$ gas when other process conditions were the same as the above described conditions. The variations in weight of the obtained CF films were examined. The results thus obtained are shown in FIG. 7. Furthermore, the flow ratio means $C_5F_8/C_2H_4$, and the flow rate of $C_5F_8$ was fixed to 60 sccm. As can be seen from the results, the variation in weight is small, 1.4%, when the flow ratio is 3. As the flow ratio decreases, the variation in weight decreases substantially in proportion thereto. When the flow ratio is less than 1, it is difficult to deposit a thin-film due to film peeling.

Figure 8:
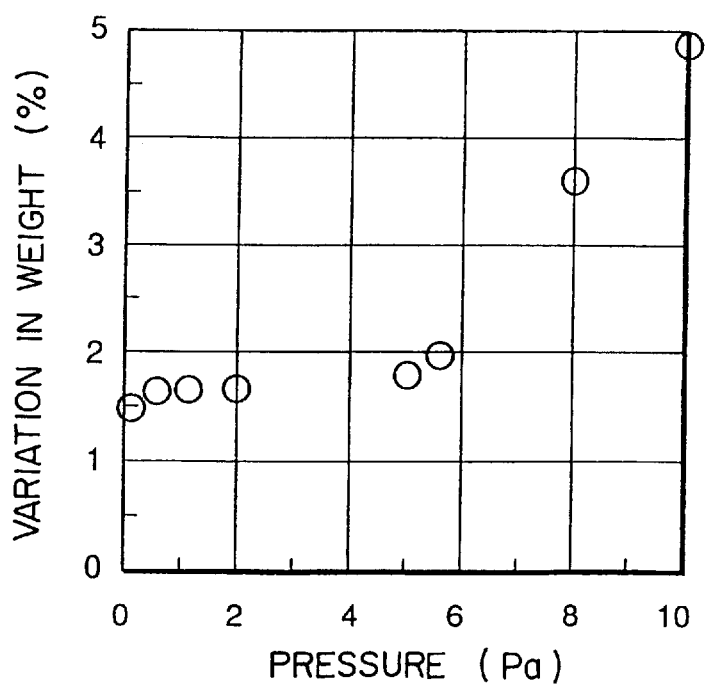
FIG. 8 is a characteristic diagram showing the relationship between the variations in weight of a CF film, which is deposited using cyclic $C_5F_8$ gas and $C_2H_4$ gas, and process pressures.

Moreover, CF films were deposited at a process temperature of 400° C. under various process pressures when the flow rates of $C_5F_8$ gas and $C_2H_4$ gas were set to be 60 sccm and 20 sccm, respectively, and when other process conditions were the same as the above described conditions. The variations in weight of the obtained CF films were examined. The results thus obtained are shown in FIG. 8. As can be seen from the results, the variation in weight is small, 2% or less, when the process pressure is lower than or equal to 5.5 Pa.

EXAMPLE 2

CF films were obtained on various process conditions using hydrogen gas ($H_2$ gas) in place of $C_2H_4$ gas in Example 1. The variations in weight of the obtained CF films were examined. First, the temperature during the thin-film deposition was set to be any one of five temperatures, 300° C., 350° C., 360° C., 400° C. and 420° C., and the variations in weight of the CF films obtained at the respective process temperatures were examined. The results thus obtained are shown in FIG. 9.

In the above process, the flow rates of $C_5F_8$, $H_2$ and Ar gases were set to be 60 sccm, 40 sccm and 150 sccm, respectively. In addition, the microwave power (the high-frequency power supply part 24) and the bias power (the high-frequency power supply part 42) were set to be 2000 W and 1500 W, respectively. Moreover, the process pressure was set to be 0.2 Pa.

Figure 9:
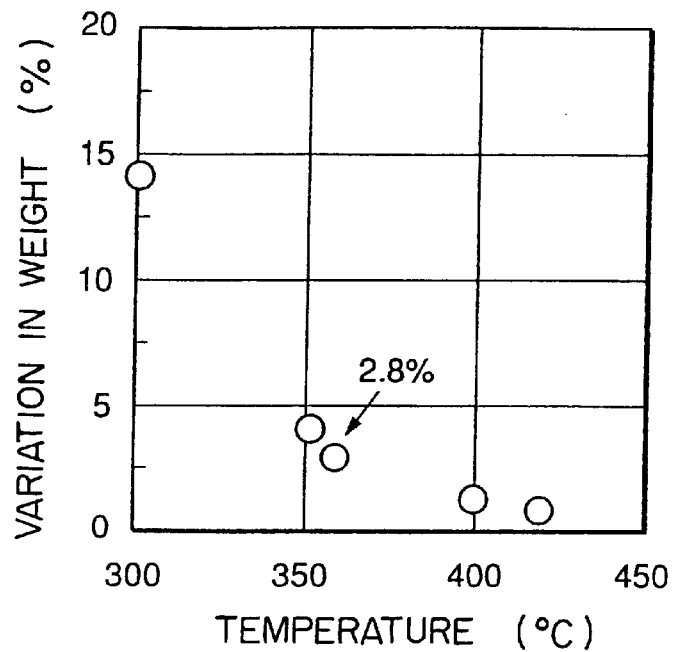
FIG. 9 is a characteristic diagram showing the relationship using cyclic $C_5F_8$ gas and $C_2H_4$ gas, and process temperatures.

As can be seen from FIG. 9, the temperature dependency was substantially the same as that in Example 1. The variation in weight at a process temperature of 360° C. is 2.8% which is less than 3%, and the variation in weight at a process temperature of 400° C. or higher is 1.5% which is very low, so that thermostability is high and the amount of degassing is small. Furthermore, no thin-film was deposited due to film peeling at a temperature of higher than 420° C.

Figure 10:
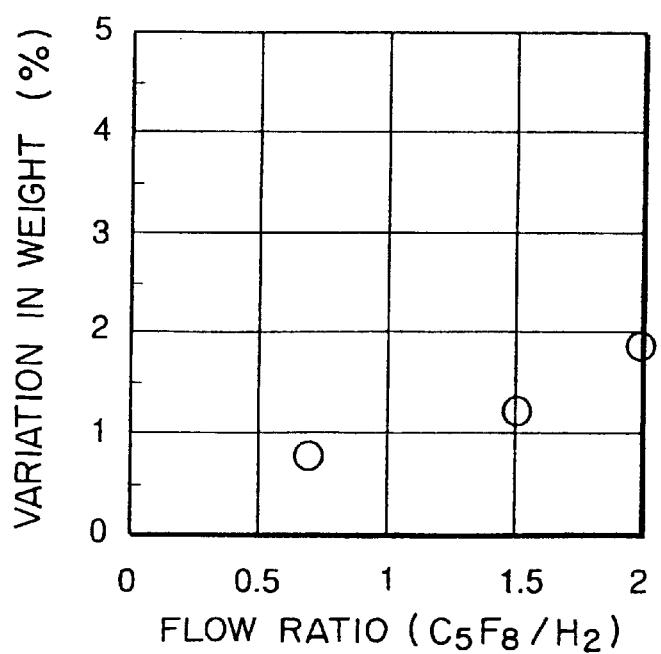
FIG. 10 is a characteristic diagram showing the relationship between the variations in weight of a CF film, which is deposited using cyclic $C_5F_8$ gas and $C_2H_4$ gas, and the flow ratios of thin-film deposition gases.

In addition, CF films were deposited at a process temperature of 400° C. at various flow ratios of $C_5F_8$ gas to $H_2$ gas when other process conditions were the same as the above described conditions. The variations in weight of the obtained CF films were examined. The results thus obtained are shown in FIG. 10. Furthermore, the flow ratio means $C_5F_8/H_2$, and the flow rate of $C_5F_8$ was fixed to 60 sccm. When the flow rate was less than 0.8, no thin-film was deposited. On the other hand, even if the flow rate exceeded 2, no thin-film was deposited. In this range, the variation in weight was small, 2% or less.

Figure 11:
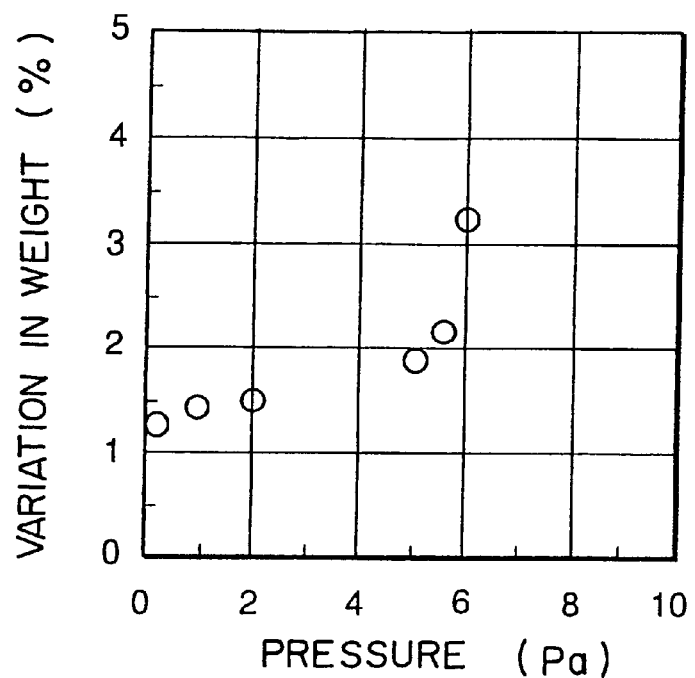
FIG. 11 is a characteristic diagram showing the relationship between the variations in weight of a CF film, which is deposited using cyclic $C_5F_8$ gas and $C_2H_4$ gas, and process pressures.

Moreover, CF films were deposited at a process temperature of 400° C. under various process pressures when the flow rates of $C_5F_8$ gas and $H_2$ gas were set to be 60 sccm and 40 sccm, respectively, and when other process conditions were the same as the above described conditions. The variations in weight of the obtained CF films were examined. The results thus obtained are shown in FIG. 11. As can be seen from the results, the pressure dependency is substantially the same as that in Example 1, and the variation in weight is small, 2% or less, when the process pressure is lower than or equal to 5.5 Pa.

EXAMPLE 3

CF films were obtained using linear $C_5F_8$ gas (which will be hereinafter referred to as <$C_5F_8$ gas>) in place of cyclic $C_5F_8$ gas as a thin-film deposition gas when the temperature during the thin-film deposition was set to be any one of seven temperatures, 300° C., 325° C., 350° C., 360° C., 400° C., 420° C. and 440° C. The variations in weight of the CF films obtained at the respective process temperatures were examined. The results thus obtained are shown in FIG. 12.

In the above process, the flow rates of <$C_5F_8$ gas>, $C_2H_4$ gas and Ar gas were set to be 60 sccm, 20 sccm and 150 sccm, respectively. In addition, the microwave power (the high-frequency power supply part 24) and the bias power (the high-frequency power supply part 42) were set to be 2000 W and 1500 W, respectively. Moreover, the process pressure was set to be 0.1 Pa.

Figure 12:
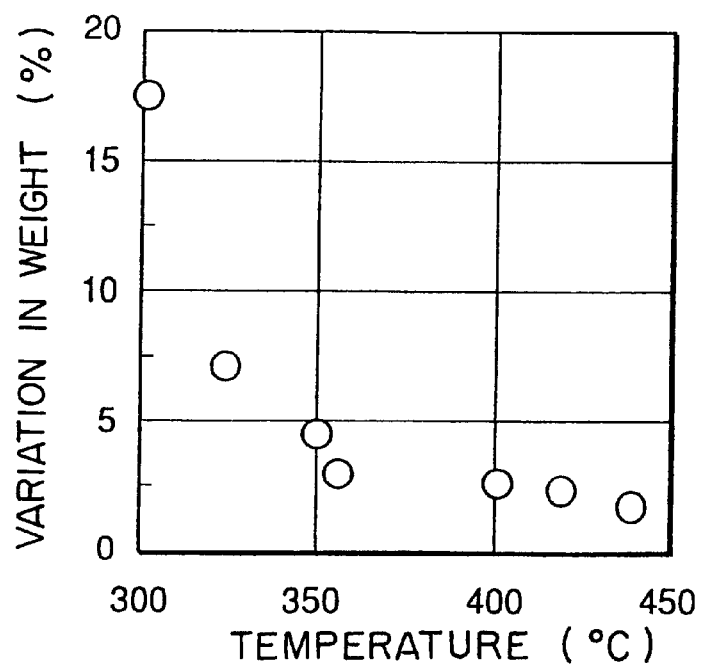
FIG. 12 is a characteristic diagram showing the relationship between the variations in weight of a CF film, which is deposited using linear $C_5F_8$ gas and $C_2H_4$ gas, and process temperatures.

As can be seen from FIG. 12, the temperature dependency was substantially the same as that in Example 1. The variation in temperature at a process temperature of 360° C. is 2.8%, and the variation in temperature is substantially constant even if the process temperature rises. In the case of <$C_5F_8$ gas>, the variation in weight of the CF film exceeds 2% which is greater than that in the case of cyclic $C_5F_8$ gas used in Example 1, although <$C_5F_8$ gas> has the same molecular formula as that of cyclic $C_5F_8$ gas. It is considered that the reason for this is that cyclic $C_5F_8$ gas more easily form a three-dimensional structure. However, the variation in weight is less than 3%, and thermostability is higher than that of $C_4F_8$ gas which will be described later, so that <$C_5F_8$ gas> is effectively used as a thin-film deposition gas.

Figure 13:
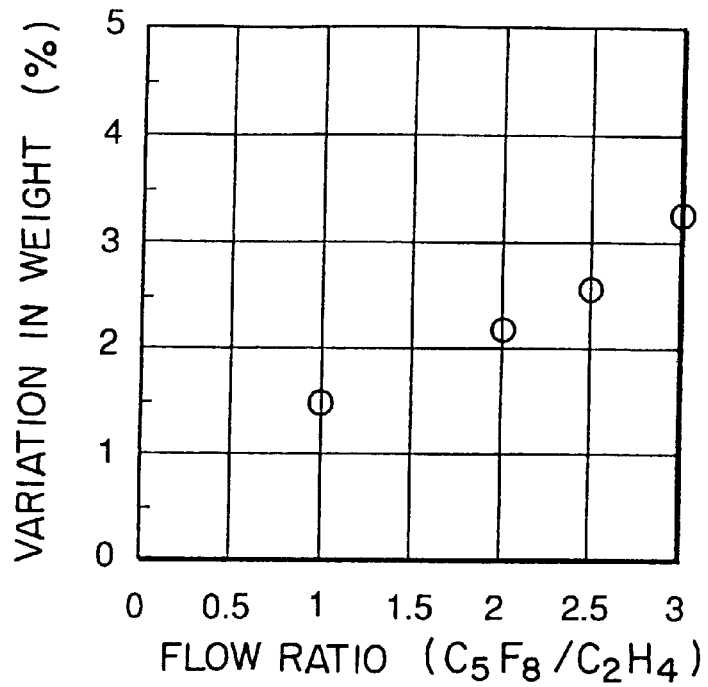
FIG. 13 is a characteristic diagram showing the relationship between the variations in weight of a CF film, which is deposited using linear $C_5F_8$ gas and $C_2H_4$ gas, and the flow ratios of thin-film deposition gases.

In addition, CF films were deposited at a process temperature of 400° C. at various flow ratios of <$C_5F_8$ gas> to $C_2H_4$ gas when other process conditions were the same as the above described conditions. The variations in weight of the obtained CF films were examined. The results thus obtained are shown in FIG. 13. Furthermore, the flow ratio means <$C_5F_8$>/$C_2H_4$, and the flow rate of <$C_5F_8$ gas> was fixed to 60 sccm. When the flow rate was less than 1, it was difficult to maintain the deposited thin-film due to film peeling.

Figure 14:
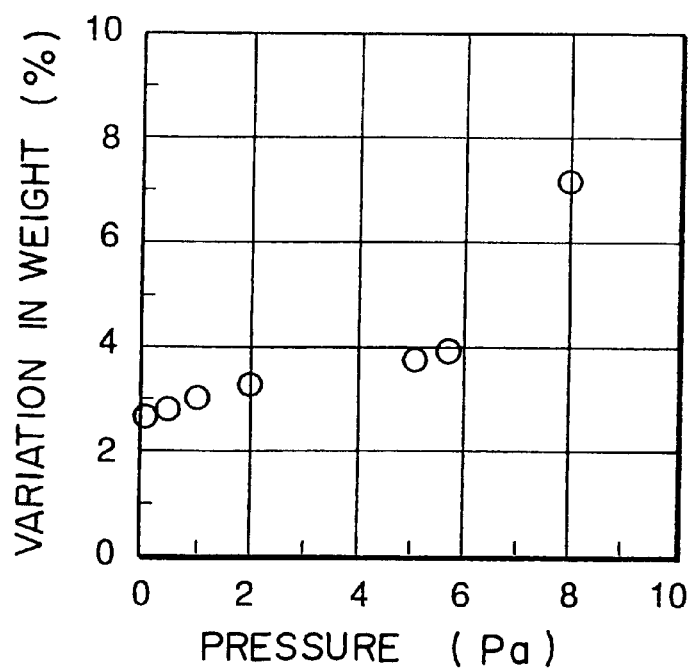
FIG. 14 is a characteristic diagram showing the relationship between the variations in weight of a CF film, which is deposited using linear $C_5F_8$ gas and $C_2H_4$ gas, and process pressures.
Figure 15:
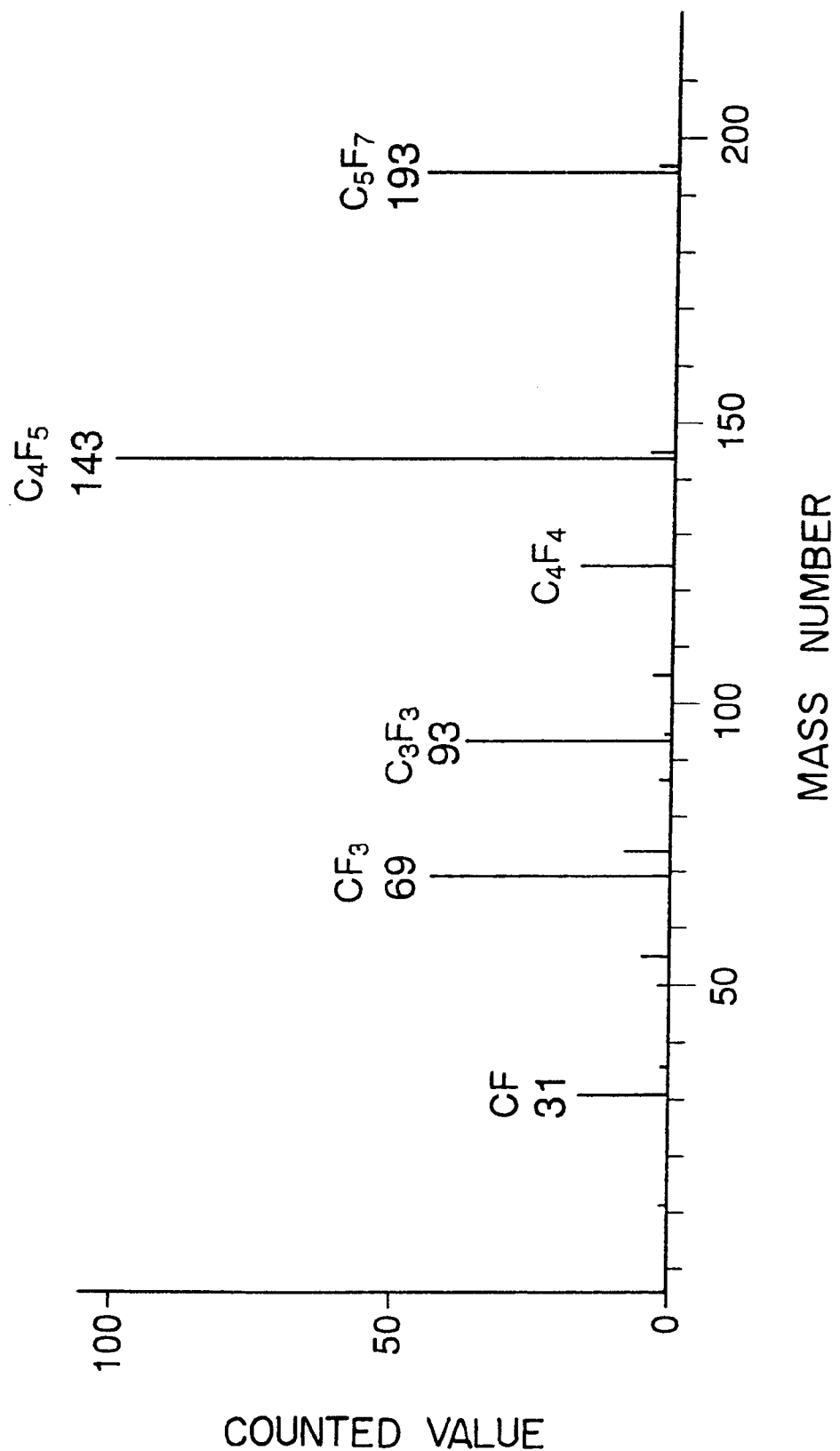
FIG. 15 is a characteristic diagram showing the results of a mass spectrometry when linear $C_5F_8$ gas is decomposed.

Moreover, CF films were deposited at a process temperature of 400° C. under various process pressures when the flow rates of <$C_5F_8$ gas> and $C_2H_4$ gas were set to be 40 sccm and 20 sccm, respectively, and when other process conditions were the same as the above described conditions. The variations in weight of the obtained CF films were examined. The results thus obtained are shown in FIG. 14. As can be seen from the results, the pressure dependency is different from that in Example 1, and the variation in weight is not 3% or less unless the process pressure is 0.3 Pa or less. FIG. 15 shows the results of the mass spectrometry for <$C_5F_8$ gas>. It is guessed from these decomposition products that the CF film has a three-dimensional network structure.

COMPARATIVE EXAMPLE

CF films were obtained using cyclic $C_4F_8$ gas in place of cyclic $C_5F_8$ gas as a thin-film deposition gas. The variations in weight of the obtained CF films were examined. The variation in weight was very large, 3.7%. In this process, the flow rates of $C_4F_8$ and $C_2H_4$ gases were set to be 40 sccm and 30 sccm, respectively, and the process pressure was set to be 0.1 Pa. In addition, the microwave power was set to be 2700 W, and other conditions were the same as those in Example 1.

Figure 16:
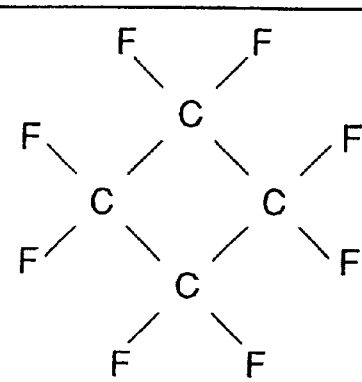
FIG. 16 is a schematic diagram showing the variations in weight of CF films in Examples and Comparative Examples.
Figure 17:
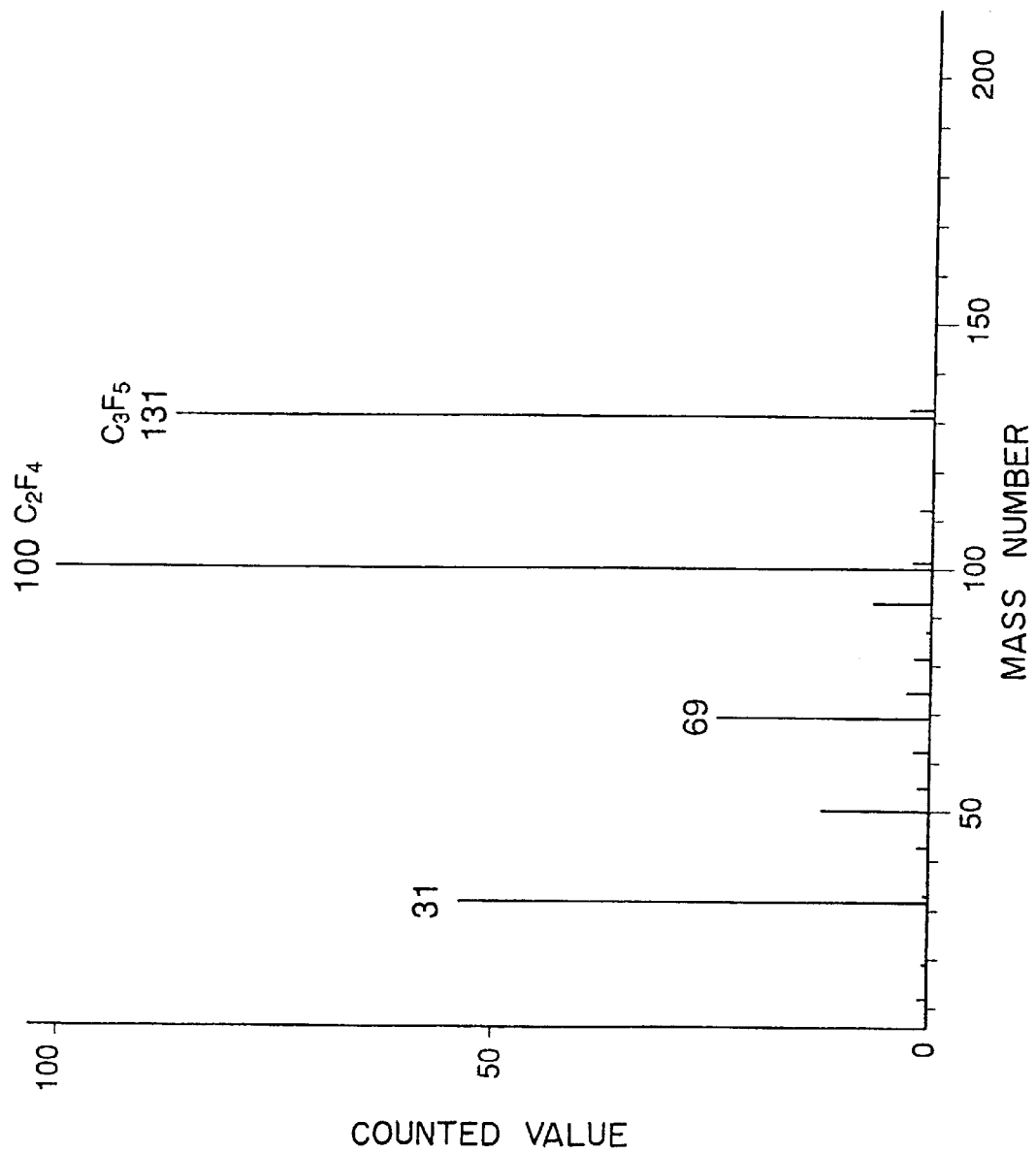
FIG. 17 is a characteristic diagram showing the results of a mass spectrometry when $C_4F_8$ gas is decomposed.

FIG. 16 shows the variation in weight of the thin-films deposited at a process temperature of 400° C. in Examples 1 and 3 and Comparative Example. As can be seen from these results, the variation in weight in the case of $C_4F_8$ gas is greater than that in the case of $C_5F_8$ gas or <$C_5F_8$ gas>. It is guessed that the reason for this is that the CF film obtained by causing $C_4F_8$ gas to be decomposed and recombined as shown in FIG. 4 has many straight chain structures to have weak C—F bonds, so that the amounts of desorbed F, CF and $CF_2$ are large when heat is applied thereto. Furthermore, FIG. 17 shows the results of the mass spectrometry for $C_4F_8$ gas. As described above, it can be seen that many $C_2F_4$ exist as decomposition results.

Figure 18:
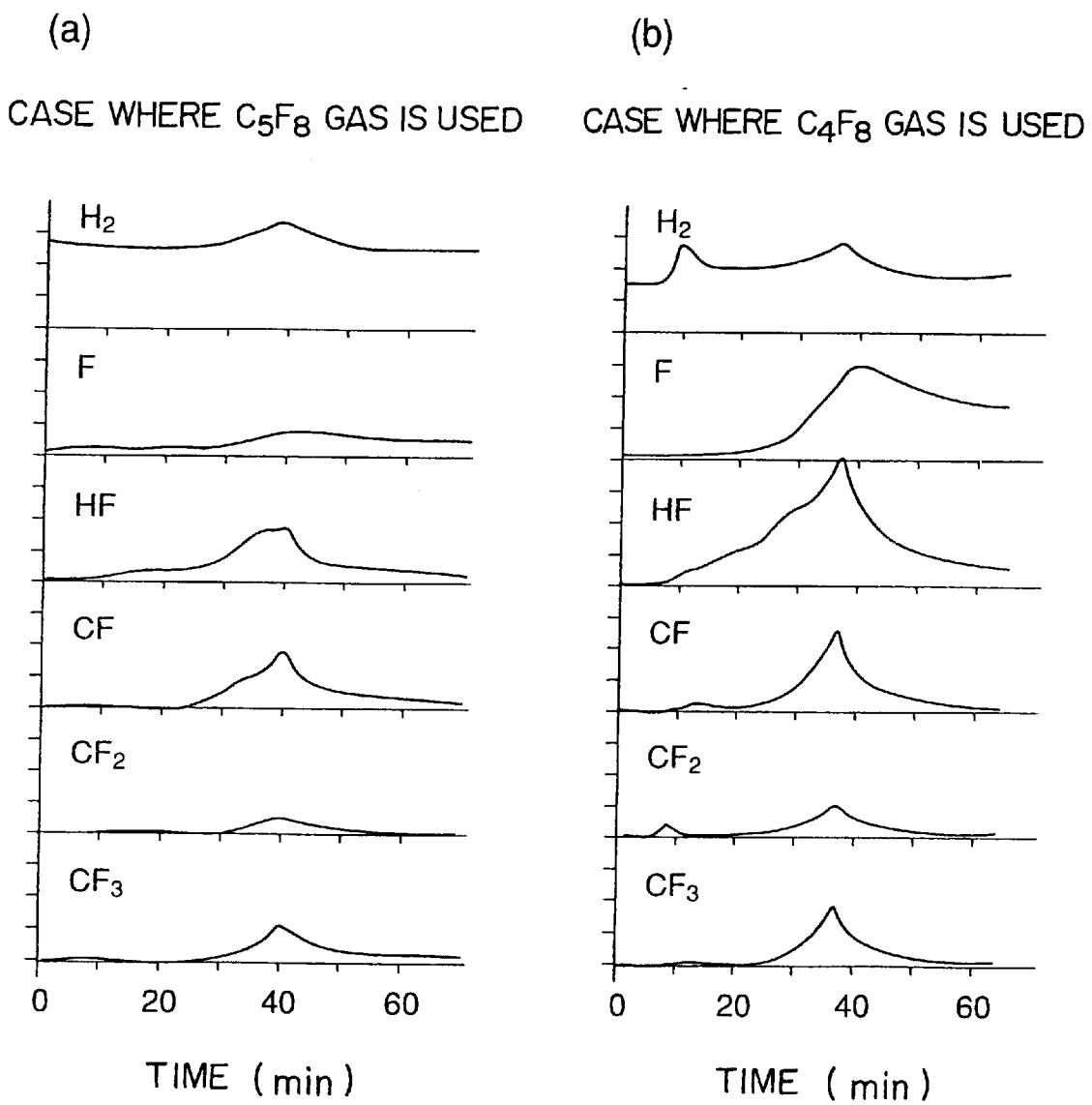
FIG. 18 is a characteristic diagram showing the results of a mass spectrometry for CF films at a high temperature.
Figure 19:
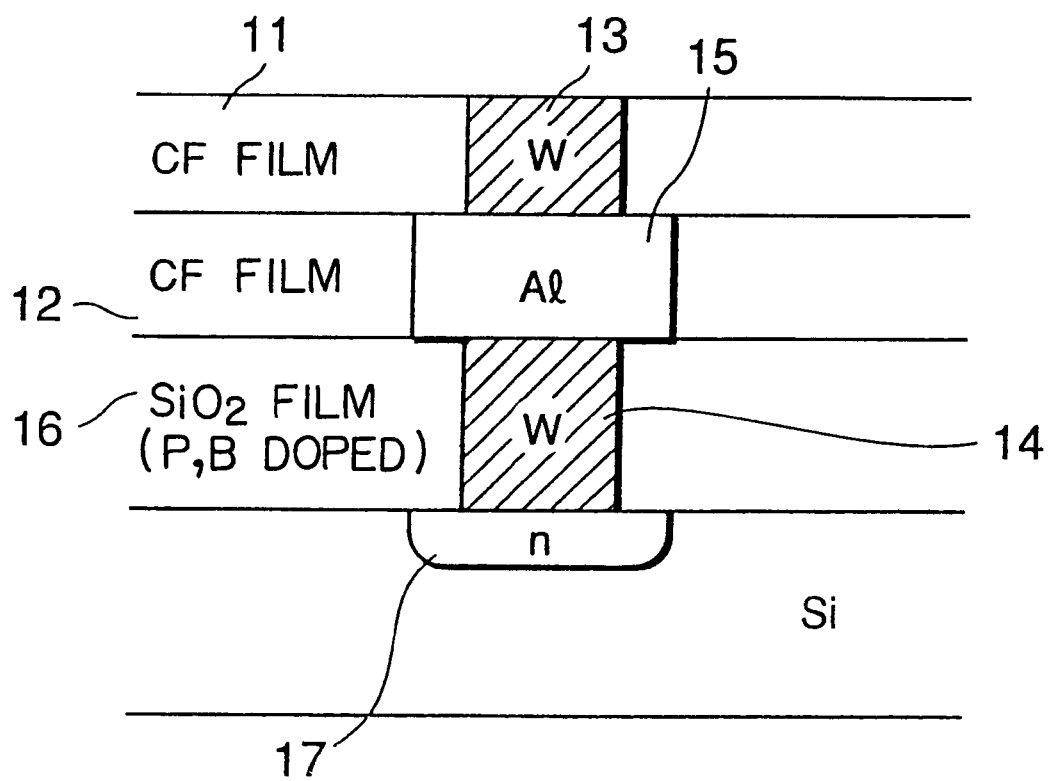
FIG. 19 is a structural drawing showing an example of the structure of a semiconductor device.

In addition, the mass spectrometry was carried out at a high temperature with respect to the CF films obtained at a process temperature of 400° C. using cyclic $C_5F_8$ gas and $C_4F_8$ gas, respectively. Specifically, this measurement was carried out by a mass spectrometer connected to a vacuum vessel, in which a predetermined amount of thin-film was put and the interior of which was heated to 425° C. The results are shown in FIGS. 19(a) and 18(b). In these drawings, the axis of ordinates denotes a dimensionless amount corresponding to the intensity of spectrum, and the peaks thereof denote the desorption of the respective gases. In addition, the axis of abscissas denotes time after the temperature rise in the vacuum vessel begins. The temperature rises at a rate of 10° C./min from room temperature. After the temperature reaches 425° C., it is held for 30 minutes.

The amounts of F and HF desorbed from the CF films according to the present invention shown in FIG. 8(a) are far smaller than those in Comparative Example shown in FIG. 8(b). The amounts of CF, $CF_2$ and $CF_3$ shown in FIG. 8(a) are also smaller than those in FIG. 8(b). It can be also seen from the results of the mass spectrometry that the CF films deposited using cyclic $C_5F_8$ gas have strong bonds and high stability.

Moreover, according to the present invention, the plasma producing method should not be limited to the ECR, the plasma may be produced by, e.g., a method called ICP (Inductive Coupled Plasma) for applying electric and magnetic fields to a process gas from a coil wound onto a dome-shaped container.

The second preferred embodiment of the present invention will be described below.

A method for depositing an interlayer dielectric film of a CF film on a wafer W, which is a substrate to be treated, using the system shown in FIG. 1 will be described. First, a gate valve (not shown) provided in the side wall of the vacuum vessel 2 is open, and the wafer W, on which, e.g., an aluminum wiring has been formed, is introduced from a load-lock chamber (not shown) by means of a transport arm (not shown) to be put on the mounting table 4 to be electrostatically absorbed by means of the electrostatic chuck 41.

Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, a plasma producing gas, e.g., Ar gas, is introduced from the plasma gas nozzles 31 into the first vacuum chamber 21 at a predetermined flow rate, and a thin-film deposition gas is introduced from the thin-film deposition gas supply part 5 into the second vacuum chamber 22 at a predetermined flow rate.

This preferred embodiment is characterized by the thin-film deposition gas. As the thin-film deposition gas, a gas of a compound having a benzene ring (an aromatic compound), e.g., $C_6F_6$ (hexafluorobenzene), is used. Furthermore, when one kind of $C_6F_6$ is used as the thin-film deposition gas, it is supplied from one of the gas supply pipes 52 and 53 into the vacuum vessel 2 via the thin-film deposition gas supply part 51. Then, the interior of the vacuum vessel 2 is held at a predetermined process pressure, and a bias voltage of, e.g., 13.56 MHz and 1500 W, is applied to the mounting table 4 by means of the high-frequency power supply part 42. In addition, the surface temperature of the mounting table 4 is set to be about 400° C.

A high-frequency wave (a microwave) of 2.45 GHz from the high-frequency power supply part 24 passes through the waveguide 25 to reach the ceiling of the vacuum vessel 2, and passes through the transmission window 23 to be introduced into the first vacuum chamber 21. On the other hand, a magnetic field extending from the upper portion of the first vacuum chamber 21 to the lower portion of the second vacuum chamber 22 is formed in the vacuum vessel 2 by the electromagnetic coils 26 and 27. The intensity of the magnetic field is, e.g., 875 gausses, in the vicinity of the lower portion of the first vacuum chamber 21. The electron cyclotron resonance is produced by the interaction between the magnetic field and the microwave. By this resonance, Ar gas is activated as plasma and enriched. The plasma flows from the first vacuum chamber 21 into the second vacuum chamber 22 to activate $C_6F_6$, which have been supplied thereto, to form active species to deposit a CF film on the wafer W. Furthermore, when a device is actually produced, the CF film is etched with a predetermined pattern, and, e.g., a W film is embedded in a groove portion to form a W wiring.

Figure 20:
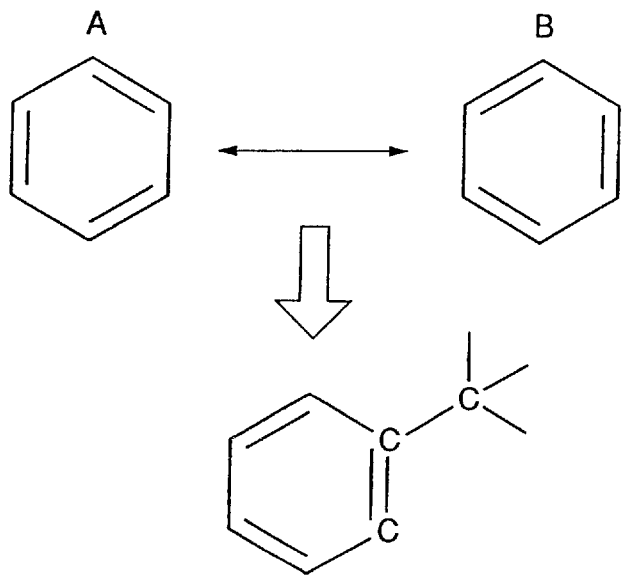
FIG. 20 is a schematic diagram for explaining the decomposition and recombination of a thin-film deposition gas for use in the second preferred embodiment of the present invention.

The CF film thus deposited has a strong bond, and high thermostability as can be seen from the results of experiment which will be described later. The reason for this is that benzene ring is stable since it resonates between states A and B so that each of C—C bonds is in the intermediate state between a single bond and a double bond as shown in FIG. 20. Therefore, it is considered that the C—C bonds of the benzene ring existing in the CF film, and the bonds between C of the benzene ring and C outside the benzene ring have strong bonding force, so that the amounts of the desorbed CF, $CF_2$ and $CF_3$ are small.

Figure 21:
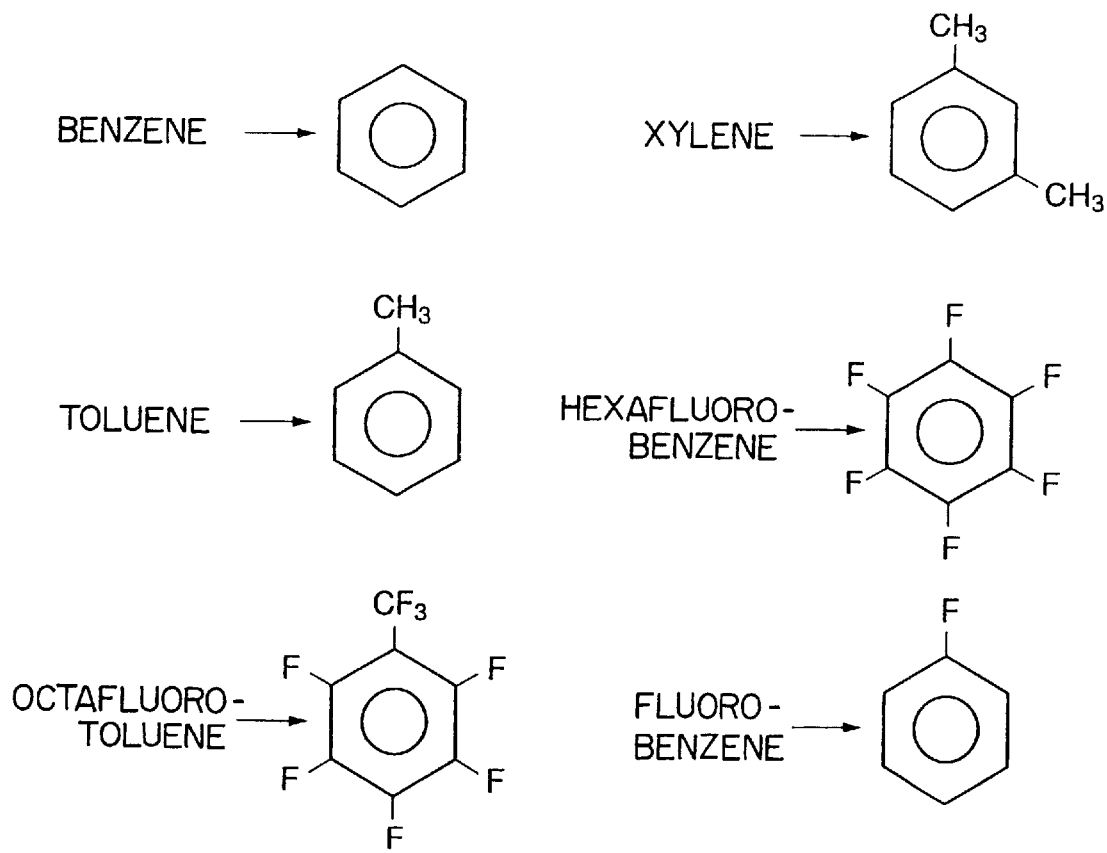
FIG. 21 is a schematic diagram showing molecular formulae of examples of thin-film deposition gases.
Figure 22:
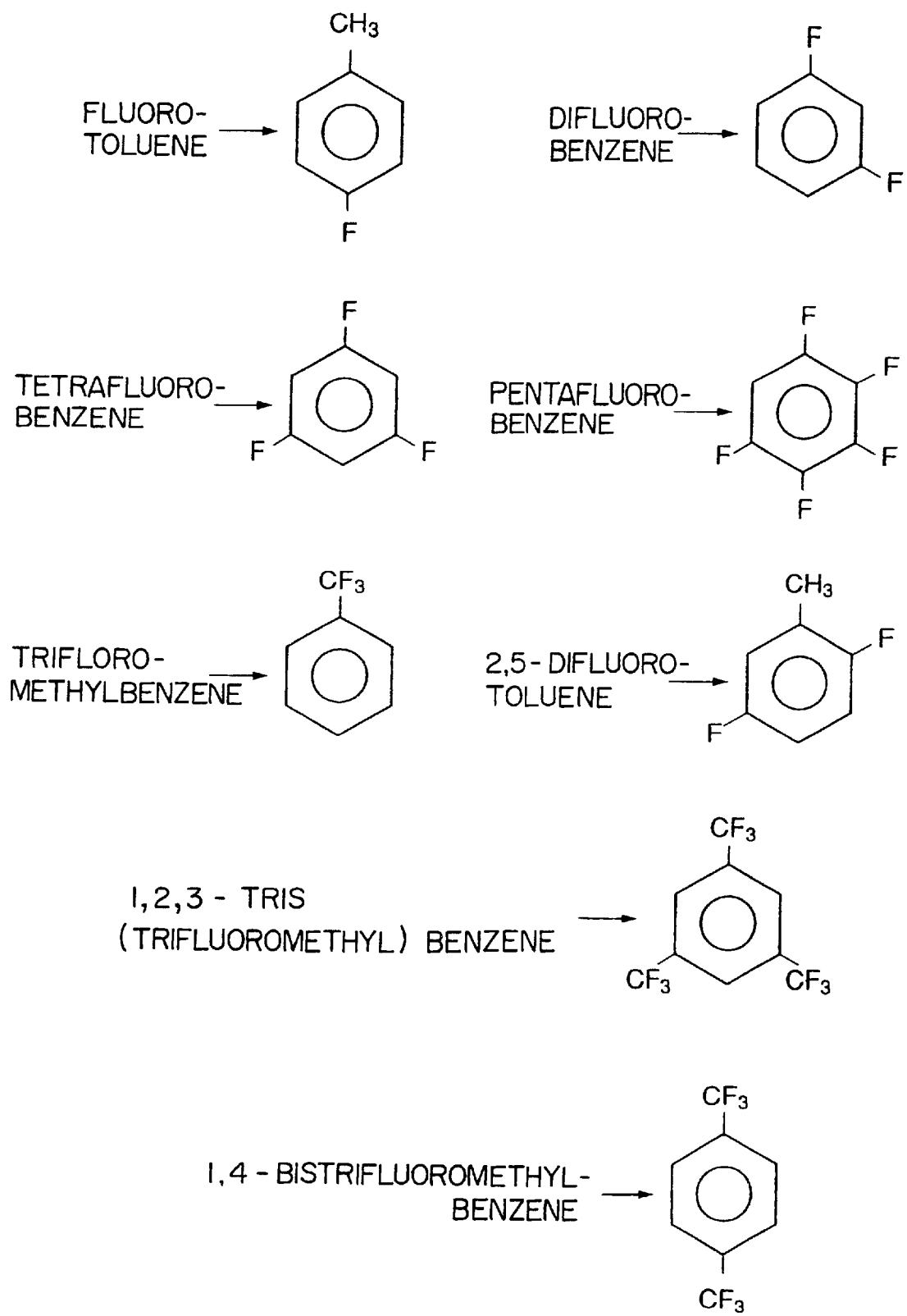
FIG. 22 is a schematic diagram showing molecular formulae of examples of thin-film deposition gases.

FIGS. 21 and 22 show examples of benzene ring containing compounds for use in the present invention.

EXAMPLE 1

Using a measuring device shown in FIG. 5, the variation in weight of a thin-film at a high temperature was examined as an index of the thermostability of the thin-film. In FIG. 5, reference number 61 denotes a vacuum vessel, 62 denoting a heater, 63 denoting a crucible suspended from a beam of a light balance mechanism, and 64 denoting a weight measuring part. As a measuring method, there was adopted a method for shaving a CF film on a wafer to put the shaven CF film in the crucible 63 to raise the temperature in the crucible 63 to 425° C. under a vacuum atmosphere to heat the CF film for 2 hours to examine the variation in weight in the weight measuring part 64. In the thin-film deposition process described above in the preferred embodiment, the flow rates of $C_6F_8$ (hexafluorobenzene) gas and Ar gases were set to be 40 sccm and 30 sccm, respectively. In addition, the temperature of the wafer W was set to be 400° C., and the process pressure was set to be 0.06 Pa. Moreover, the microwave power (the power of the high-frequency power supply part 24) and the bias power (the power of the high-frequency power supply part 42) were set to be various values. The variations in weight of the CF films obtained on the respective conditions were examined. Furthermore, the variation in weight means a value of $\{(A-B)/A\} \times 100$ assuming that the weight of the thin-film in the crucible before heating is A and the weight of the thin-film in the crucible after heating is B.

Figure 24:
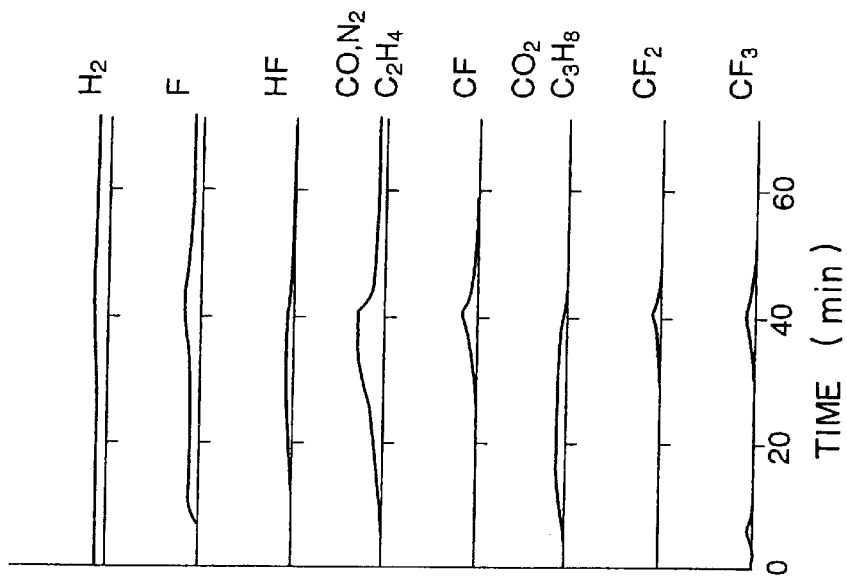
FIG. 24 is a characteristic diagram showing the results of a mass spectrometry for CF films at a high temperature in Example.

Moreover, the mass spectrometry was carried out at a high temperature with respect to the CF films obtained at a microwave power of 1.0 kW at a bias power of 1.5 kW on the aforementioned process conditions. Specifically, this measurement was carried out by a mass spectrometer connected to a vacuum vessel, in which a predetermined amount of thin-film was put and the interior of which was heated to 425° C. The results are shown in FIGS. 24. In this drawing, the axis of ordinates denotes a dimensionless amount corresponding to the intensity of spectrum, and the peaks thereof denote the desorption of the respective gases. In addition, the axis of abscissas denotes time after the temperature rise in the vacuum vessel begins. The temperature rises at a rate of 10° C./min from room temperature. After the temperature reaches 425° C., it is held for 30 minutes.

EXAMPLE 2

A CF film was deposited on the wafer on the same conditions as those in Example 1, except that $C_7F_8$ (octafluorotoluene) gas was substituted for $C_6F_6$ gas, the flow rates of $C_7F_8$ gas and Ar gas were set to be 40 sccm and 40 sccm, respectively, the process pressure was 0.07 Pa, the microwave power was set to be 1.0 kW and the bias power was set to be 1.0 kW. With respect to this CF film, the variation in weight was examined in the same manner as that in Example 1. The variation in weight was 1.9% (see FIG. 23).

EXAMPLE 3

A CF film was deposited on the wafer on the same conditions as those in Example 1, except that $C_4F_8$ gas and $C_7H_5F_3$ (trifluoromethylbenzene) gas were substituted for $C_6F_6$ gas, the flow rates of $C_4F_8$ gas, $C_7H_5F_3$ gas and Ar gas were set to be 20 sccm, 20 sccm and 30 sccm, respectively, the process pressure was 0.07 Pa, the microwave power was set to be 1.0 kW and the bias power was set to be 1.0 kW. With respect to this CF film, the variation in weight was examined in the same manner as that in Example 1. The variation in weight was 2.0% (see FIG. 23).

COMPARATIVE EXAMPLE

A CF film was deposited on the wafer on the same conditions as those in Example 1, except that $C_4F_8$ gas and $C_2H_4$ gas were substituted for $C_6F_6$ gas, the flow rates of $C_4F_8$ gas, $C_2H_4$ gas and Ar gas were set to be 40 sccm, 30 sccm and 150 sccm, respectively, the process pressure was set to be 0.22 Pa, the microwave power was set to be 2.0 kW and the bias power was set to be 1.5 kW. With respect to this CF film, the variation in weight was examined in the same manner as that in Example 1. The variation in weight was 4.4% (see FIG. 23).

Figure 25:
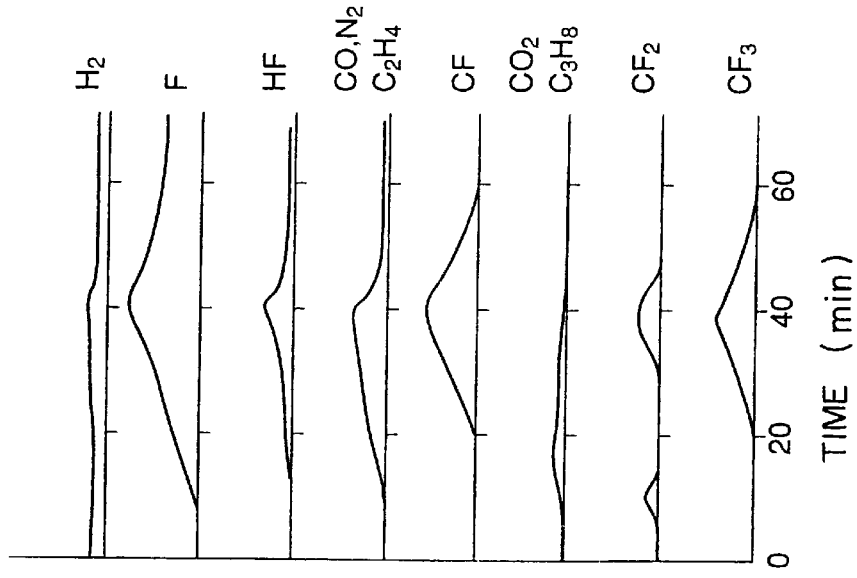
FIG. 25 is a characteristic diagram showing the results of a mass spectrometry for CF films at a high temperature in Comparative Example.

Moreover, with respect to this CF film, the mass spectrometry was carried out in the same manner as that in Example 1. The results thereof are shown in FIG. 25.

CONSIDERATION

As can be seen from Examples 1 and 2, when $C_6F_6$ gas or $C_7F_8$ gas is used, the variation in weight is a level of 1%, so that thermostability is high and the amount of degassing is small. In particular, when $C_6F_6$ gas is used, thermostability is very high. As can be seen from the comparison of FIG. 24 with FIG. 25, when $C_6F_6$ gas is used, the amounts of the desorbed CF, $CF_2$ and $CF_3$ are smaller than those when $C_4F_8$ gas and $C_2H_4$ gas are used. This meets the guess that C—C bonds are difficult to be cut when a material gas of an aromatic compound is used as described above. It is considered that the decomposition products of $C_6F_6$ gas are $C_6F_6$, $C_5F_3$, $C_3F_3$ and so forth which have double bonds. The recombination product thereof has a three-dimensional structure and strong bonds. Even at a high temperature, the bonds of the recombination product are difficult to be cut, so that the amount of degassing is small.

It is guessed that the reason why the variations in weight in Examples 3 and 4 is a level of 2%, which is greater than those in Examples 1 and 2 although it is less than that in Comparative Example, is as follows. That is, if $C_7F_8$ gas or $C_7H_5F_3$ gas is used alone, F is insufficient, so that $C_4F_8$ gas is added. The network structure is reduced by the thin-film deposited on the basis of the decomposition products of $C_7F_8$ gas, so that the C—C bonds are cut to be desorbed as CF, $CF_2$ and $CF_3$. As a result, the variation in weight is greater than that when $C_6F_6$ gas or $C_7F_8$ gas is used.

Figure 26:
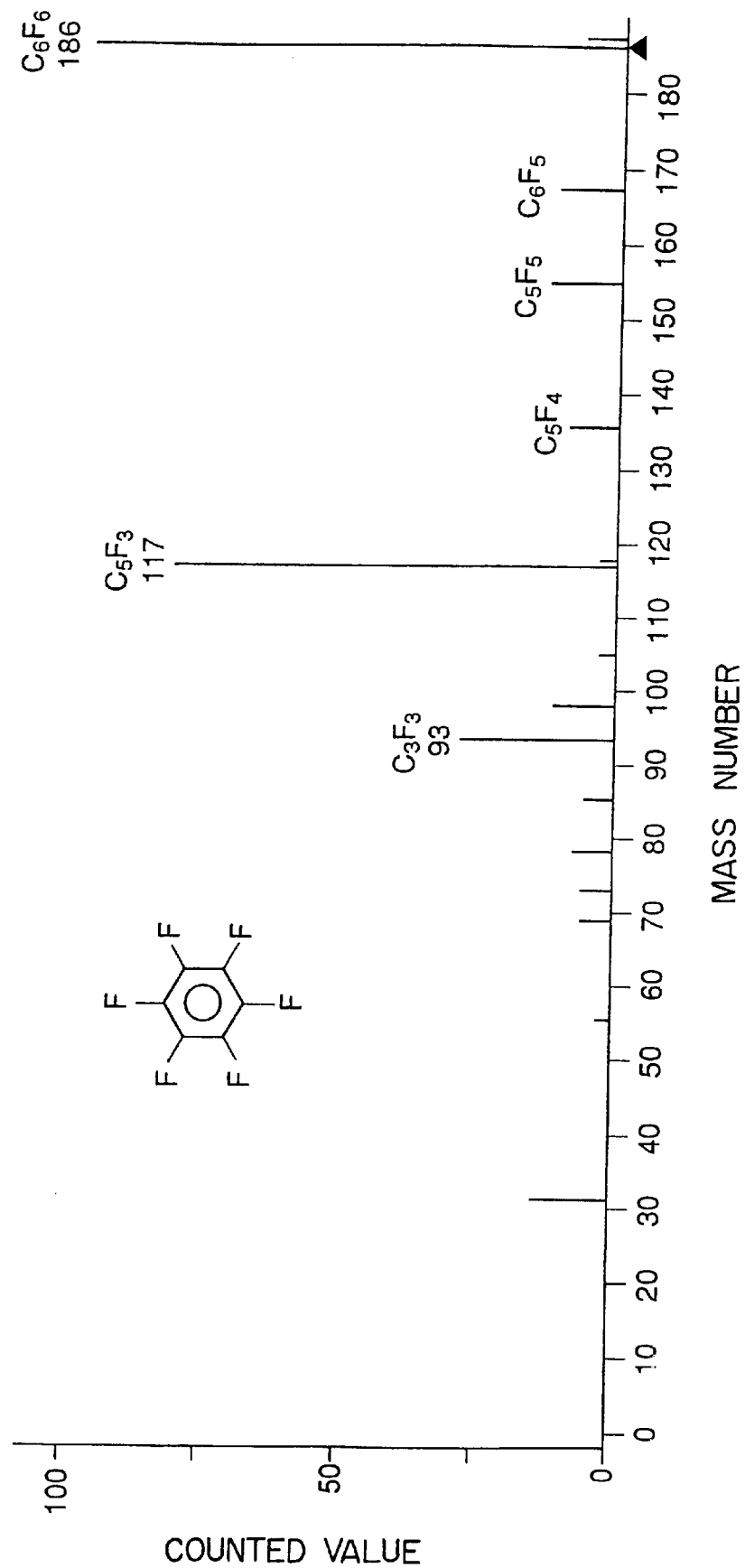
FIG. 26 is a characteristic diagram showing the results of a mass spectrometry when hexafluorobenzene is decomposed.
Figure 27:
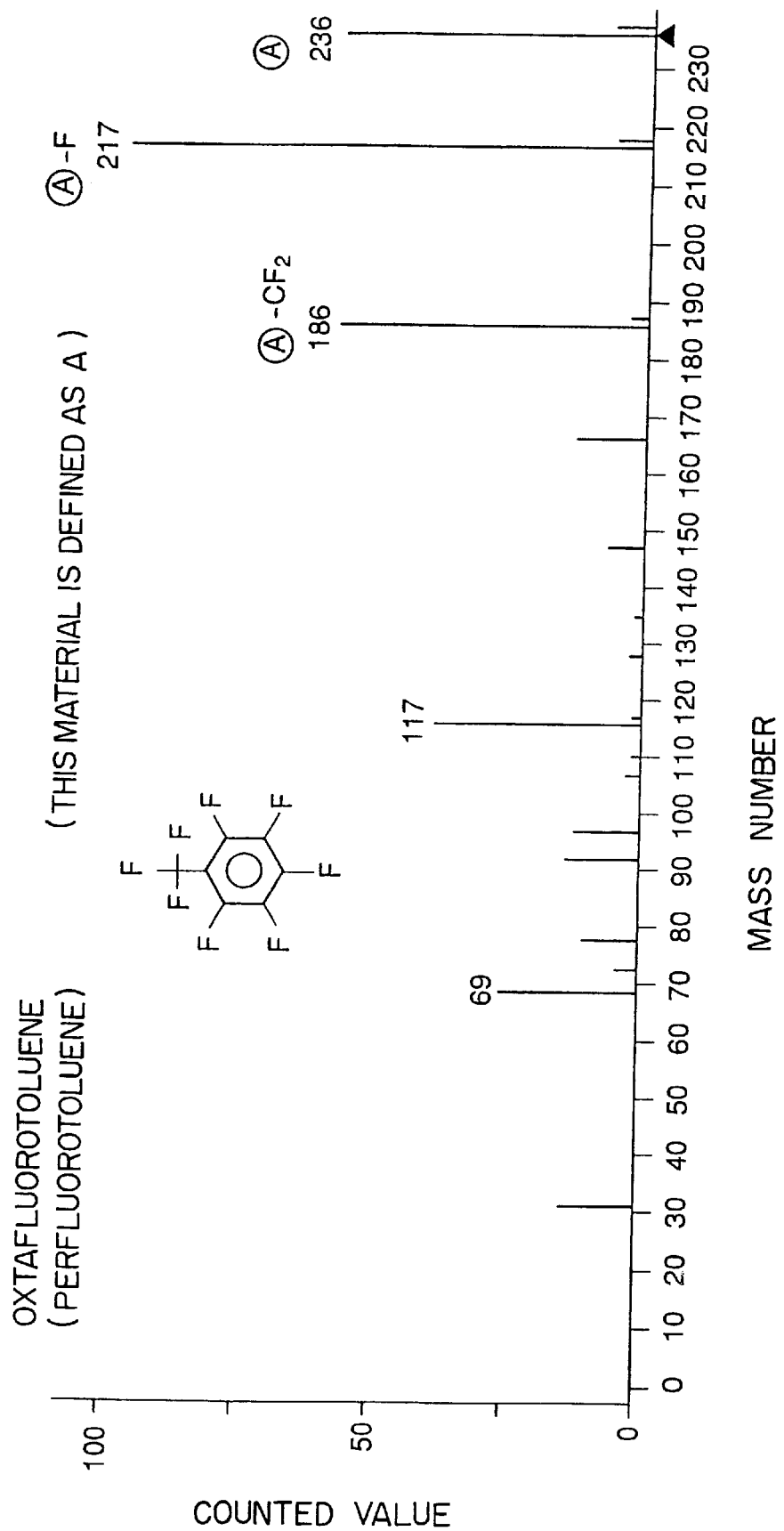
FIG. 27 is a characteristic diagram showing the results of a mass spectrometry when octafluorotoluene is decomposed.
Figure 28:
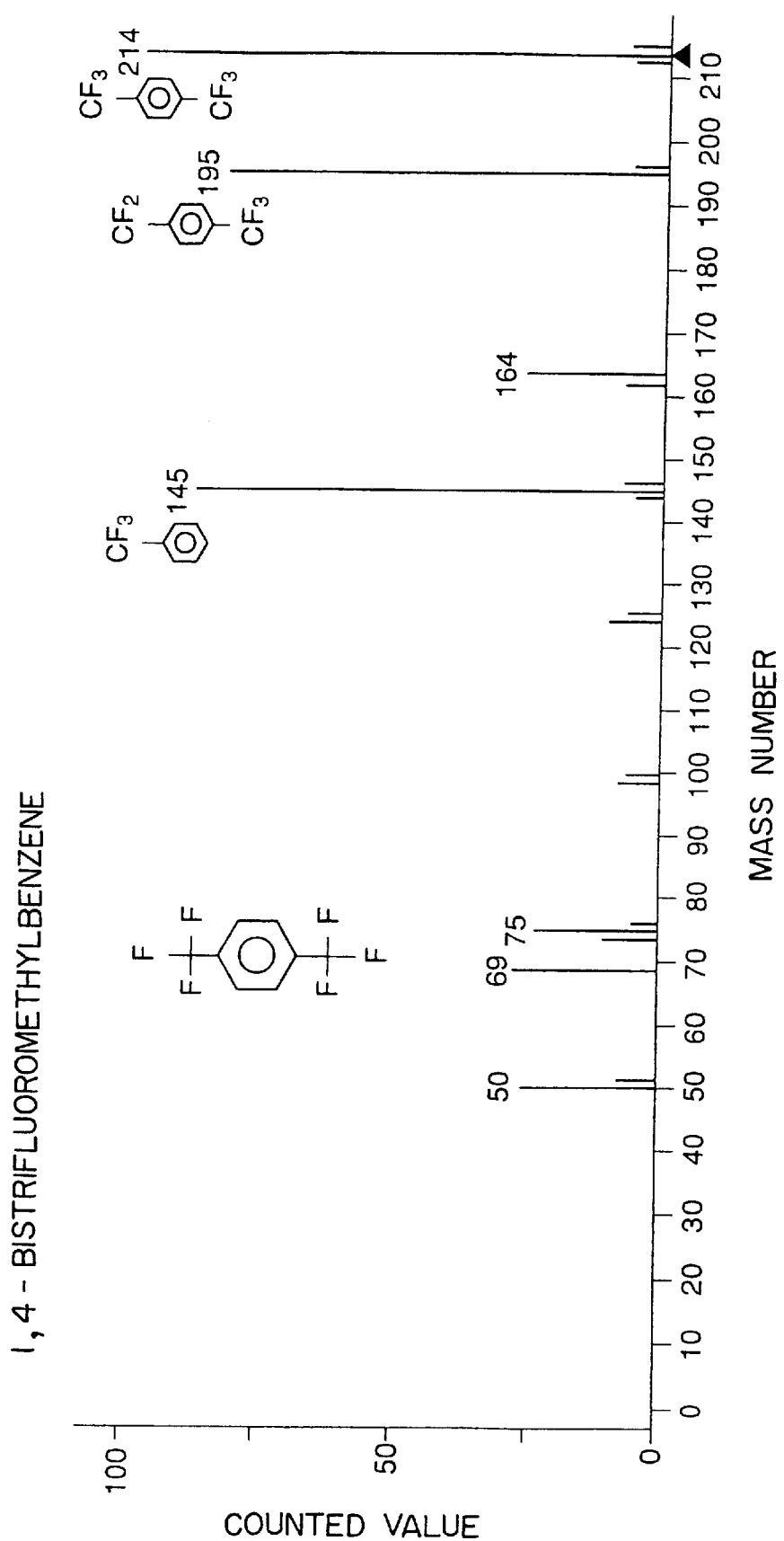
FIG. 28 is a characteristic diagram showing the results of a mass spectrometry when 1,4-bistrifluoromethylbenzene is decomposed.

The decomposition products of $C_6F_6$, $C_7F_8$ and $C_8H_4F_6$ (1,4-bistrifluoromethylbenzene) are vaporized under a reduced pressure of 0.002 Pa, and the vaporized decomposition products were analyzed by means of a mass spectrometer. The obtained results are shown in FIGS. 26 through 28. It can be seen from these results that many benzene ring containing components exist as decomposition products, so that it can be guessed that a stable CF film having a network structure is produced.

Moreover, according to the present invention, the plasma producing method should not be limited to the ECR, the plasma may be produced by, e.g., a method called ICP (Inductive Coupled Plasma) for applying electric and magnetic fields to a process gas from a coil wound onto a dome-shaped container.

The first and second preferred embodiments of the present invention have been described above. According to these preferred embodiments, it is possible to produce a CF film which has high thermostability and a small amount of desorbed F gas. Therefore, if this CF film is used as, e.g., an interlayer dielectric film of a semiconductor device, it is possible to prevent the corrosion of a metal wiring, the swell of an aluminum wiring and the crack of the film. Since CF films have been widely noticed as insulator films having a small relative dielectric constant and since the scale down and high integration of semiconductor devices have been required, the present invention is effective in the practical use of CF films as insulator films.

What is claimed is:

1. A plasma thin-film deposition method for depositing an interlayer dielectric film, which is formed when producing a semiconductor device having a multilevel interconnection structure, said method comprising the steps of:
   introducing a plasma producing gas;
   activating the plasma producing gas to produce a plasma;
   introducing a thin-film deposition gas containing cyclic $C_5F_8$ gas;
   activating the thin-film deposition gas by the plasma; and
   depositing a fluorine containing carbon film serving as said interlayer dielectric film on a substrate to be treated with the activated thin-film deposition gas.

2. A plasma thin-film deposition method as set forth in claim 1, wherein said thin-film deposition gas further comprises at least one of hydrocarbon gas and hydrogen.

3. A plasma thin-film deposition method as set forth in claim 1, wherein said fluorine containing carbon film is deposited under a processing pressure of 5.5 Pa or lower.

4. A plasma thin-film deposition method as set forth in claim 1, wherein the temperature of said substrate to be treated is 360° C. or higher.

5. A plasma thin-film deposition method comprising the steps of:

introducing a plasma producing gas;

activating the plasma producing gas to produce a plasma;

introducing a thin-film deposition gas containing linear $C_5F_8$ gas;

activating the thin-film deposition gas by the plasma; and depositing an insulator film of a fluorine containing carbon film on a substrate to be treated with the activated thin-film deposition gas.

6. A plasma thin-film deposition method as set forth in claim 5, wherein said thin-film deposition gas further comprises at least one of hydrocarbon gas and hydrogen.

7. A plasma thin-film deposition method as set forth in claim 5, wherein said insulator film is deposited under a process pressure of 0.3 Pa or lower.

8. A plasma thin-film deposition method as set forth in claim 5, wherein the temperature of said substrate to be treated is 360° C. or higher.

9. A plasma thin-film deposition method comprising the steps of:

introducing a plasma producing gas;

activating the plasma producing gas to produce a plasma;

introducing a thin-film deposition gas containing at least one selected from a group consisting of $C_5F_8$, $C_6F_6$, $C_7F_8$, and $C_7H_5F_3$;

activating the thin-film deposition gas by the plasma; and depositing a fluorine containing carbon film on a substrate to be treated with said activated thin-film deposition gas.

10. A plasma thin-film deposition method as set forth in claim 9, wherein said thin-film deposition gas further comprises at least one of a hydrocarbon gas and hydrogen.

11. A plasma thin-film deposition method as set forth in claim 9, wherein said fluorine containing carbon film is deposited under a processing pressure of 5.5 Pa or lower.

12. A plasma thin-film deposition method as set forth in claim 9, wherein the temperature of said substrate to be treated is 360° C. or higher.

* * * * *